(12) United States Patent
Kondo et al.

(10) Patent No.: US 10,192,650 B2
(45) Date of Patent: Jan. 29, 2019

(54) PHOTOSENSITIVE CONDUCTIVE PASTE, METHOD OF PRODUCING MULTILAYER ELECTRONIC COMPONENT USING THE SAME, AND MULTILAYER ELECTRONIC COMPONENT

(71) Applicant: Murata Manufacturing Co., Ltd., Nagaokakyo-shi, Kyoto-fu (JP)

(72) Inventors: Kenta Kondo, Nagaokakyo (JP); Tomonori Sakata, Nagaokakyo (JP); Masahiro Kubota, Nagaokakyo (JP); Machiko Motoya, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 23 days.

(21) Appl. No.: 15/584,227

(22) Filed: May 2, 2017

(65) Prior Publication Data
US 2017/0236611 A1    Aug. 17, 2017

Related U.S. Application Data

(63) Continuation of application No. PCT/JP2015/077484, filed on Sep. 29, 2015.

(30) Foreign Application Priority Data

Nov. 13, 2014    (JP) .................................. 2014-230871

(51) Int. Cl.
*H01B 1/22*    (2006.01)
*B05D 5/12*    (2006.01)
(Continued)

(52) U.S. Cl.
CPC ................. *H01B 1/22* (2013.01); *B05D 5/12* (2013.01); *C03C 3/076* (2013.01); *C03C 3/089* (2013.01);
(Continued)

(58) Field of Classification Search
CPC ... H01B 1/00; H01B 1/16; H01B 1/22; B05D 5/12; C03C 8/00; C03C 8/18; G03F 7/00; G03F 7/004; G03F 7/40
See application file for complete search history.

(56) References Cited

U.S. PATENT DOCUMENTS

2004/0191690 A1*  9/2004  Hayakawa ............ G03F 7/0047
                                                    430/277.1
2008/0238318 A1* 10/2008  Lee ....................... G03F 7/0007
                                                    313/582
(Continued)

FOREIGN PATENT DOCUMENTS

JP    2006-253094 A    9/2006
JP    2009-031693 A    2/2009
(Continued)

OTHER PUBLICATIONS

JP 2009-031693 (pub date Dec. 2, 2009) English language machine translation. (Year: 2009).*
(Continued)

*Primary Examiner* — Mark Kopec
(74) *Attorney, Agent, or Firm* — Arent Fox LLP

(57) ABSTRACT

A photosensitive conductive paste that contains (a) a conductive powder in an amount of 70.3 to 85.6 mass % with respect to the total amount of the photosensitive conductive paste; (b) a photosensitive resin composition containing an alkali-soluble polymer, a photosensitive monomer, a photopolymerization initiator, and a solvent; and (c) a glass frit. The mass ratio of the glass frit to the conductive powder is 0.020 to 0.054, and the glass frit has a softening point that is equal to or above the temperature at which sintering of the conductive powder starts.

18 Claims, 3 Drawing Sheets

(51) Int. Cl.
*C03C 3/00* (2006.01)
*C03C 8/18* (2006.01)
*C09D 5/24* (2006.01)
*G03F 7/004* (2006.01)
*G03F 7/038* (2006.01)
*H05K 1/02* (2006.01)
*H05K 1/09* (2006.01)
*C03C 3/076* (2006.01)
*C03C 3/089* (2006.01)
*C03C 3/091* (2006.01)
*C03C 8/02* (2006.01)
*C03C 8/04* (2006.01)
*G03F 7/029* (2006.01)
*G03F 7/031* (2006.01)
*G03F 7/033* (2006.01)
*H05K 3/02* (2006.01)
*H05K 3/46* (2006.01)

(52) U.S. Cl.
CPC ............... *C03C 3/091* (2013.01); *C03C 8/02* (2013.01); *C03C 8/04* (2013.01); *C03C 8/18* (2013.01); *C09D 5/24* (2013.01); *G03F 7/0047* (2013.01); *G03F 7/029* (2013.01); *G03F 7/031* (2013.01); *G03F 7/033* (2013.01); *G03F 7/038* (2013.01); *H05K 1/028* (2013.01); *H05K 1/095* (2013.01); *H05K 3/02* (2013.01); *H05K 3/4629* (2013.01); *H05K 2203/0514* (2013.01)

(56) References Cited

U.S. PATENT DOCUMENTS

| | | |
|---|---|---|
| 2009/0053483 A1 | 2/2009 | Ito et al. |
| 2010/0039034 A1 | 2/2010 | Ito et al. |
| 2013/0026424 A1* | 1/2013 | Kuroki ............... H01B 1/22 252/512 |

FOREIGN PATENT DOCUMENTS

| | | |
|---|---|---|
| JP | 2010-217683 A | 9/2010 |
| JP | 2012-093742 A | 5/2012 |
| JP | 5163687 B2 | 3/2013 |
| WO | WO 2007/123270 A1 | 11/2007 |

OTHER PUBLICATIONS

International Search Report issued in International Patent Application No. PCT/JP2015/077484, dated Dec. 28, 2015.
Written Opinion of the International Searching Authority issued in International Patent Application No. PCT/JP2015/077484, dated Dec. 28, 2015.

* cited by examiner

PHOTOSENSITIVE CONDUCTIVE PASTE, METHOD OF PRODUCING MULTILAYER ELECTRONIC COMPONENT USING THE SAME, AND MULTILAYER ELECTRONIC COMPONENT

CROSS REFERENCE TO RELATED APPLICATIONS

The present application is a continuation of International application No. PCT/JP2015/077484, filed Sep. 29, 2015, which claims priority to Japanese Patent Application No. 2014-230871, filed Nov. 13, 2014, the entire contents of each of which are incorporated herein by

FIELD OF THE INVENTION

The present invention relates to a photosensitive conductive paste for use in forming a desired conductor pattern such as a circuit or an electrode on a substrate, a method of producing a multilayer electronic component using the photosensitive conductive paste, and a multilayer electronic component.

BACKGROUND OF THE INVENTION

In recent years, a method of producing a multilayer ceramic circuit board by using a photosensitive conductive paste has been widely used. One of such photosensitive conductive pastes is a photosensitive conductive paste which has been reported in Patent Document 1.

The photosensitive conductive paste of Patent Document 1 is a photosensitive conductive paste that contains metallic particles (Ag particles), a resin having an acidic functional group, and a photoreactive organic constituent and that has a structure in which (a) the median particle size of the metallic particles is 1.5 to 5.0 µm, (b) the ratio of the median particle size of the metallic particles to the crystallite diameter of the metallic particles (median particle size/crystallite diameter) is 35 to 90, and (c) the organic constituent content of the metallic particles is 0.10 mass % or less.

Patent Document 1 states that, when this photosensitive conductive paste is used as a conductive paste for forcing internal conductors (conductor layers) in the case where, for example, a multilayer electronic component constituted by the internal conductors stacked together with insulation layers therebetween is produced, it is possible to reduce or prevent the occurrence of delamination between the internal conductors and the insulation layers, an increase in electrical resistance of the conductor layers, a decrease in insulation performance due to gaps or babbles in the insulation layers, and the like and obtain a multilayer electronic component having good characteristics.

However, in the case where the photosensitive conductive paste of Patent Document 1 is used as a conductive paste for forming inner electrodes, the following problems arise. Since the photosensitive conductive paste shrinks more than the constituent material (ceramic material, which will become insulation layers) of a ceramic multilayer body when fired, the occurrence of delamination cannot necessarily be reduced sufficiently. Furthermore, the above-described difference in firing shrinkage causes a structural defect such as electrode disconnection.

One way to reduce the above-described firing shrinkage is to increase the amount of metallic particles (Ag particles) in the photosensitive conductive paste. However, this has a problem in that increasing the amount or the metallic particles (Ag particles) reduces light transmittance when the applied photosensitive conductive paste is patterned by photolithography and causes a difficulty in precise patterning.

Patent Document 1: Japanese Patent No. 5163687

SUMMARY OF THE INVENTION

The present invention was made in an attempt to solve the above problems, and an object or the present invention is to provide a photosensitive conductive paste that, for example, even when used in forming conductor layers in the production of a multilayer electronic component through a process of forming a multilayer device by co-firing the conductor layers and insulation layers, is capable of reducing or preventing the occurrence of delamination between the conductor layers and insulation layers and that can be precisely patterned. Also provided is a method of producing a multilayer electronic component using the photosensitive conductive paste, and a multilayer electronic component produced by the method which has good characteristics.

In order to attain the above object, the present invention provides a photosensitive conductive paste containing (a) a conductive powder in an amount of 70.3 to 85.6 mass % respect to the total amount of the photosensitive conductive paste, (b) a photosensitive resin composition containing an alkali-soluble polymer, a photosensitive monomer, a photopolymerization initiator, and a solvent, and (c) a glass frit, wherein: the mass ratio of the glass frit to the conductive powder is 0.020 to 0.054; and the glass frit has a softening point; that is equal to or above a temperature at which sintering of the conductive powder starts.

It is preferable that the softening point of the glass frit is 560° C. or higher, With the use of a glass frit having a softening point of 560° C. or higher, it is possible to reduce the firing shrinkage and more reliably prevent a disconnection in an electrode that is formed through the firing process. This makes it possible to make the present invention more effective.

It is preferable that the absolute value of the difference in refractive index between the photosensitive resin composition and the glass frit is 0.10 or less.

With the use of a glass frit in which the absolute value of the difference in refractive index between the photosensitive resin composition and the glass frit is 0.10 or less, when, for example, performing patterning by photolithography, it is possible to reduce the scattering or light at the interface between the photosensitive resin composition and the glass frit and achieve a high resolution.

It is more preferable that the absolute value of the difference in refractive index between the photosensitive resin composition and the glass frit is 0.03 or less.

With the use of a glass frit in which the absolute value of the difference in refractive index between the photosensitive resin composition and the glass frit is 0.03 or less, it is possible to more reliably reduce the scattering of light at the interface between the photosensitive resin composition and the glass frit and achieve a higher resolution.

It is preferable that the conductive powder accounts for 70.3 to 82.0 mass % of the total amount of the photosensitive conductive paste.

When the conductive powder accounts for 70.3 to 82.0 mass %, it is possible to reduce firing shrinkage, which occurs when the percentage of the conductive powder is low, as well as reducing lowering of light transmittance that occurs when solid content is too much, thereby achieving a high resolution.

The present invention also provides a method of producing a multilayer electronic component, which involves co-firing a multilayer body including a conductor layer formed of the above-described photosensitive conductive paste of the present invention and an insulation layer formed of a photosensitive insulating paste containing an insulative inorganic constituent and a photosensitive organic constituent.

The present invention also provides a multilayer electronic component produced by the above-described method of the present invention, including a structure in which internal conductors each obtained by firing the conductor layer formed of the photosensitive conductive paste are stacked together with a sintered insulation layer obtained by firing the insulation layer formed of the photosensitive insulating paste therebetween.

With the use of this photosensitive conductive paste, when, for example, producing a multilayer electronic component such as a multilayer coil component, it is possible to reduce firing shrinkage and reduce delamination between a base body and an electrode and electrode disconnection, thereby obtaining a highly reliable multilayer electronic component.

Specifically, by using a glass frit having a softening point higher than the temperature at which sintering of the conductive powder starts, the glass frit, which does not melt when the sintering of the conductive powder starts, serves to reduce the firing shrinkage of the conductive powder, thereby reducing the firing shrinkage of the electrodes. As a result, for example, even when producing a multilayer electronic component including an inner electrode that is 50 μm or more in width and 15 μm or more in thickness and that accounts for a large volume of the multilayer electronic component, it is possible to reduce the occurrence of delamination and electrode disconnection (disconnection in via conductors).

It should be noted that, with the use of, for example, a glass frit containing 15 to 80 mass % of SiO2, 10 to 20 mass % of $B_2O_3$, and 15 mass % or less of $Al_2O_3$, it is possible to unfailingly obtain a photosensitive conductive paste of the present invention containing a glass frit having a softening point that is higher than the temperature at which sintering of the conductive powder starts, and, more preferably, a glass frit having a softening point of 560° C. or higher. This is preferable.

Furthermore, since the method of producing a multilayer electronic component of the present invention involves co-firing a multilayer body including a conductor layer formed of the above-described photosensitive conductive paste of the present invention and an insulation layer containing an insulative inorganic constituent and a photosensitive organic constituent, it is possible to prevent delamination and electrode disconnection which are caused by, for example, shrinkage of electrodes in the firing process, and thus possible to produce a highly reliable multilayer electronic component with high efficiency.

Furthermore, since a multilayer electronic component of the present invention is produced by the method of the present invention having the above-described arrangement, it is possible to provide a multilayer electronic component having good characteristics and no structural defects such as delamination between conductor layers (internal conductors) and insulation layers (sintered insulation layers), electrode disconnection, or the like.

DETAILED DESCRIPTION OF THE PREFERRED EMBODIMENTS

Figure 1:
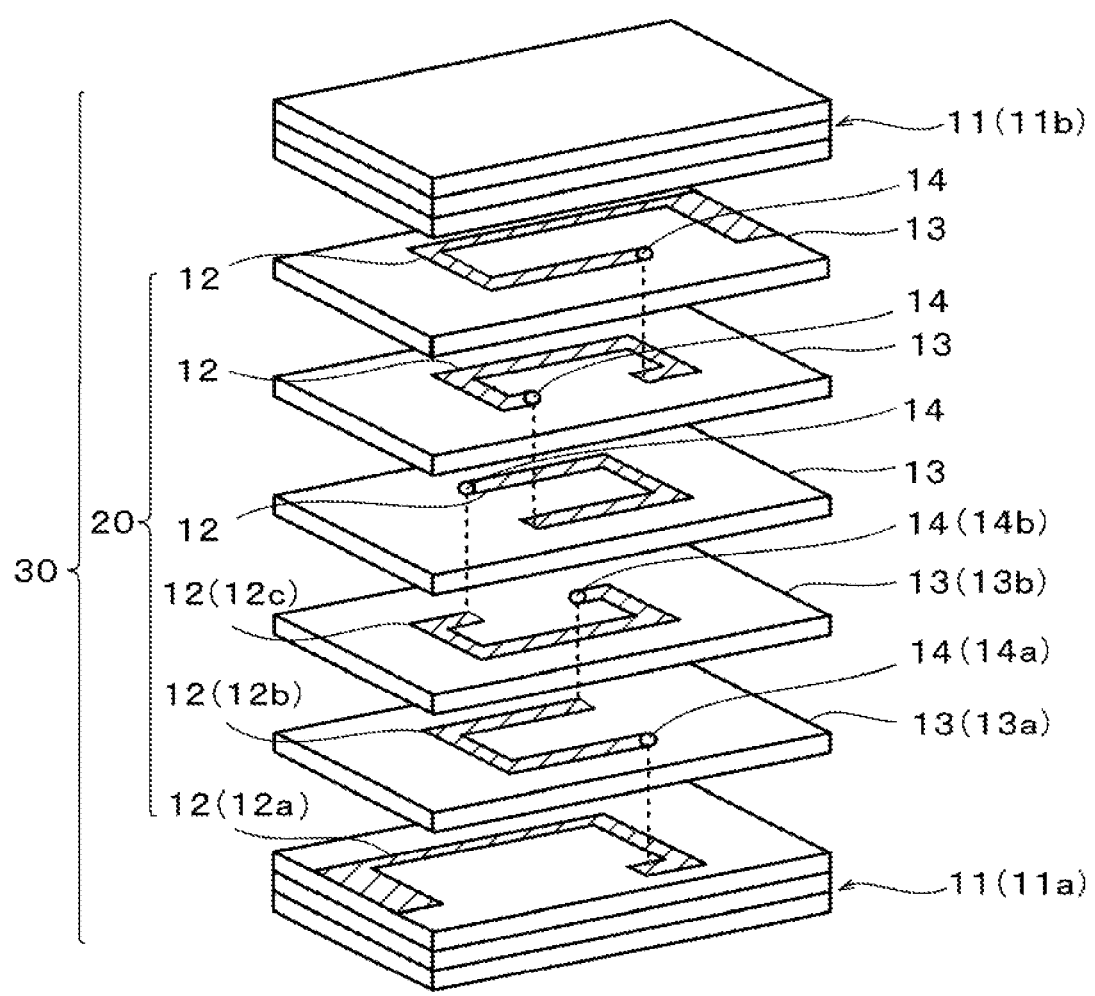
FIG. 1 describes a method of producing a multilayer electronic component (multilayer coil component) of an example of the present invention.

The following describes the characteristics of the present invention in more detail by using examples of the present invention,

[1]Preparation of photosensitive conductive paste for forming electrodes

For the preparation of a photosensitive conductive paste of the present invention, (a) a conductive powder, (b) a photosensitive resin composition, and (c) a glass frit, which are described below, were prepared.

(a) Conductive powder

Prepared conductive powders were an Ag powder (Ag powder I) having an average particle size of 4.0 μm and an Ag powder (Ag powder II) having an average particle size of 2.0 μm.

Then, the temperature at which sintering of the Ag powder I starts and the temperature at which sintering of the Ag powder II starts were determined in the following manner. The Ag powder in an amount of 0.5 g was put in a mold and pressed at a pressure of 100 MPa with a pressing machine to obtain a sample in the form of pellets. This sample was set in a thermomechanical analyzer (TMA) (Thermo plus TMA8310, available from Rigaku Corporation) and the length of the sample before temperature measurement is measured (the instrument automatically measures the length). While the sample was pressed from above with a load of 93 mN, the temperature was raised at a heating rate of 10° C./min. in an air atmosphere (air flow rate: 200 mL/min.) The temperature at a point in time in which the length of the sample had shrunk by 0.2% was read and the measured temperature was defined as a temperature at which sintering starts.

The temperature at which sintering of the Ag powder starts was measured in this way, whereby it was confirmed that the temperature at which sintering of the Ag powder I starts is 550° C. and the temperature at which sintering of the Ag powder II starts is 490° C.

(b) Photosensitive resin composition

A photosensitive resin composition was prepared by mixing the following raw materials in the proportions shown in Table 1.

(b-1) an alkali-soluble polymer: an acrylic polymer with a side chain that includes a carboxyl group (b-2) a photosensitive monomer: dipentaerythritol monohydroxy pentaacrylate (b-3) a photopolymerization initiator: 2-methyl-1[4-(methylthio) phenyl]-2-morpholino propane (b-4) a sensitizer: 2,4-diethylthioxanthone (b-5) a solvent: dipropylene glycol monomethyl ether
(b-6) a defoaming agent Then, the prepared photosensitive resin composition was applied by printing on a support film such as a PET film, dried for 1 hour at 60° C., and thereafter the refractive index was measured and found to be 1.49.

The refractive index of the photosensitive resin composition was measured with the use of an Abbe refractometer NAR-2T available from ATAGO CO., LTD.

It should be noted that, in the present embodiment, the alkali-soluble polymer constituting the photosensitive resin composition is an acrylic polymer with a side chain that includes a carboxyl group. The resin containing an acrylic copolymer with a side chain that includes a carboxylic group may be produced by, for example, copolymerizing an unsaturated carboxylic acid and an unsaturated ethylene compound.

Examples of the unsaturated carboxylic acid include acrylic acid, methacrylic acid, maleic acid, fumaric acid, vinylacetic acid, and anhydrides thereof. On the other hand, examples of the unsaturated ethylene compound include: acrylic esters such as methyl acrylate and ethyl acrylate; methacrylic esters such as methyl methacrylate and ethyl methacrylate; and fumarate esters such as monoethyl fumarate.

Alternatively, the acrylic copolymer with a side chain that includes a carboxylic group may be a copolymer obtained by introducing an unsaturated bond such as any of those described below.

1) To a carboxylic group of a side chain of an acrylic copolymer, an acrylic monomer having a functional group reactive with this carboxyl group such as, for example, an epoxy group is added.

2) An unsaturated monocarboxylic acid is reacted with an acrylic copolymer in which an epoxy group has been introduced instead of the carboxylic group of the side chain, and thereafter a saturated or unsaturated polyvalent carboxylic anhydride is further introduced.

It is preferable that the acrylic copolymer with a side chain that includes a carboxylic group have a weight average molecular weight (Mw) of 50000 or less and an acid value of 30 to 150.

Although the photosensitive monomer in the present embodiment is the above-described dipentaerythritol monohydroxy pentaacrylate, other examples of the photosensitive monomer include: hexanediol triacrylate, tripropylene glycol triacrylate, trimethylolpropane triacrylate, EO-modified trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethyleneglycol diacrylate, ethoxylated bisphenol A diacrylate, propoxylated neopentylglycol diacrylate, tris(2-hydroxyethyl)isocyanurate triacrylate, pentaerythritol triacrylate, propoxylated trimethylolpropane triacrylate, propoxylated glyceryl triacrylate, pentaerythritol tetraacrylate, ditrimethylolpropane tetraacrylate, and ethoxylated pentaerythritol tetraacrylate. Alternatively, those compounds listed above in which their acrylate in the molecule is partially or entirely replaced by methacrylate may be used.

Furthermore, although the photopolymerization initiator in the present embodiment is 2-methyl-1[4-(methylthio) phenyl]-2-morpholino propane, other examples of the photopolymerization initiator include: bensil, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyl dimethyl ketal, 2-n-butoxy-4-dimethylamino benzoate, 2-chloro thioxanthone, 2,4-diethyl thioxanthone, 2,4-diisopropyl thioxanthone, isopropylthioxanthone, 2-dimethylaminoethyl benzoate, p-dimethylamino ethyl benzoate, p-dimethylamino isoamyl benzoate, 3,3'-dimethyl-4-methoxybenzophenone, 2,4-dimethyl thioxanthone, 1-(4-dodecylphenyl)-2-hydroxy-2-methylpropane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, methyl benzoyl formate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentyl phosphine oxide, and bis(2,4,6-trimethylbenzoyl)phenylphosphine oxide.

The sensitizer, the solvent, and the defoaming agent are not particularly limited and any of the known sensitizers, solvents, and defoaming agents may be used.

TABLE 1

| Constituents | Amount of constituent in photosensitive resin composition (parts by mass) |
|---|---|
| Polymer (acrylic polymer with a side chain that includes a carboxylic group) | 39.1 |
| Monomer (dipentaerythritol monohydroxy pentaacrylate) | 17.5 |
| Photopolymerization initiator (2-methyl-1[4-(methylthio)phenyl]-2-morpholino propane) | 4.0 |
| Sensitizer (2,4-diethylthioxanthone) | 0.4 |
| Solvent (dipropylene glycol monomethyl ether) | 37.9 |
| Defoaming agent | 1.1 |

(c) Glass frit

In the present embodiment, four glass frits (glass frit A, glass frit B, glass frit C, and glass frit D) having the compositions shown in Table 2 were prepared.

It should be noted that, in regard to the softening point of each glass frit, the temperature at a point in time in which a viscosity coefficient $\eta$ of $10^7$ dPa·s had been reached was measured with the use of a Littleton viscometer and the measured temperature was used as a softening point. The refractive index of each glass frit was measured with the use of an Abbe refractometer NAR-2T available from ATAGO CO., LTD.

It should be noted that glass frit D has a softening point that is below the temperature at which sintering of the conductive powder (Ag powder) starts, i.e., below 490° C., and does not satisfy the requirements of the present invention under the conditions of the present embodiment.

TABLE 2

| Composition | Type of glass frit | | | |
|---|---|---|---|---|
| | A | B | C | D |
| $SiO_2$ | 79.0 | 46.7 | 50.0 | 53.5 |
| $B_2O_3$ | 16.1 | 14.0 | 20.0 | |
| $Al_2O_3$ | | 14.0 | | |
| CaO | | | 15.0 | |
| ZnO | | | 5.0 | |

TABLE 2-continued

| Composition | Type of glass frit | | | |
|---|---|---|---|---|
| | A | B | C | D |
| Li$_2$O | | | 10.0 | 14.0 |
| Na$_2$O | | | | 32.5 |
| K$_2$O | 4.9 | 12.0 | | |
| KF | | 13.3 | | |
| Total | 100 | 100 | 100 | 100 |
| Softening point (° C.) | 790 | 657 | 718 | 471 |
| Average particle size (μm) | 1.1 | 1.3 | 1.2 | 0.8 |
| Refractive index | 1.47 | 1.46 | 1.59 | 1.54 |

Then, (a) the conductive powder, (b) the photosensitive resin composition, and (c) the glass frit which were prepared as described above and a dispersant (additive 1) and an anti-settling agent (additive 2) were mixed together in the following percentages, that is, the percentages shown in Tables 3A and 3B, and kneaded. In this way, photosensitive conductive pastes were prepared.

Conductive powder: 68 to 88 mass %
Photosensitive resin composition: 8.6 to 28.6 mass %
Glass frit: 1.1 to 5.3 mass %
Dispersant (additive 1): 0.2 mass %
Anti-settling agent (additive 2): 0.2 mass %

[2] Preparation of photosensitive glass paste for forming insulation layer

A photosensitive glass paste for forming an insulation layer was prepared by mixing and kneading the following materials (a) to (h).

(a) Ceramic aggregate (alumina): 21.4 mass %
(alumina powder having an average particle size of 0.5 μm)

(b) Alkali-soluble polymer (acrylic polymer with a side chain that includes a carboxylic group): 28 mass %

(c) Photosensitive monomer (EO-modified trimethylolpropane acrylate): 12 mass %

(d) Photopolymerization initiator (2-methyl-1[4-(methylthio)phenyl]-2-morpholino propane): 2 mass %

(e) Solvent pentamethylene glycol: 0.6 mass %

(f) Organic dye: 1 mass %

(g) Defoaming agent: 1 mass %

(h) Glass frit (Si-B-K based glass): 34 mass %
(glass powder having a glass softening point of 790° C. and an average particle size of 1 μm)

The materials (b) to (g) of the above materials (a) to (h) are raw materials constituting the photosensitive resin composition.

[4] Preparation of multilayer printed circuit chip (multilayer electronic component)

A multilayer printed circuit chip (multilayer electronic component) was prepared in the following manner using the photosensitive conductive paste and the photosensitive glass paste prepared as described above. The following describes a method of producing a multilayer printed circuit chip (multilayer electronic component) with reference to FIGS. 1 and 2.

(a) First, the photosensitive glass paste is applied on a PET film (support film) by screen printing, dried, and thereafter exposed to light without a photomask. This process is repeated several times to form a glass layer (insulation layer) which will become an outer layer 11 (11a) having a thickness of about 100 μm (refer to FIG. 1). It should be noted that the support film is not illustrated in FIG. 1.

(b) Next, on the glass layer (insulation layer) which will become the outer layer 11 (11a) formed in the above manner, the photosensitive conductive paste is applied, by screen printing to have a film thickness of about 10 μm, dried, and thereafter selectively exposed to light and developed, such that a first conductor layer (coil pattern) 12 (12a) is formed.

(c) Furthermore, on the first conductor layer (coil pattern) 12 (12a) thus formed and the outer layer 11 (11a) around the conductor layer 12, the photosensitive glass paste is applied by screen printing (printing on the entire surface) to have a film thickness of about 15 μm, such that a first photosensitive glass paste layer (insulation layer) 13 (13a) is formed.

Then, this photosensitive glass paste layer (insulation layer) 13 (13a) is selectively exposed to light and developed, such that a via hole 14 (14a) is formed at a predetermined position.

(d) Then, the photosensitive conductive paste is applied by screen printing (printing on the entire surface) to have a film thickness of about 10 μm, and dried, followed by the selective exposure to light and development. In this way, a second coil pattern (conductor layer) 12 (12b) is formed.

(e) Furthermore, on the conductor layer 12 and the outer insulation layer 13 around the conductor layer 12, the photosensitive glass paste is applied by printing and a via hole 14 (14b) is formed, such that a second insulation layer 13 (13b) is formed.

(f) Next, a third, conductor layer 12 (12c) is formed in the same manner as in (d).

(g) After that, the above process (e) and the subsequent process (f) were repeated to form photosensitive glass paste layers (insulation layers) 13 having a via hole 14 at a predetermined position and coil patterns (conductor layers) 12 until the predetermined number of layers are obtained.

(h) Then, on the layers, the photo sensitive; glass paste is applied by screen printing in the same manner as in (a), dried, and thereafter exposed to light without a photomask, such that an outer layer 11 (11b) which is an insulation layer having a thickness of about 150 μm is formed. In this way, a multilayer structure 30, which includes therein a coil 20 constituted by the coil patterns (conductor layers) 12 on different layers which are connected together through the via holes 14, is obtained.

(i) Then, this multilayer structure 30 is divided into chips of a size of about 1 mm square, the PET film is removed, and the chips are fired, and thereafter outer electrodes are formed at opposite end portions of each chip.

Figure 2:
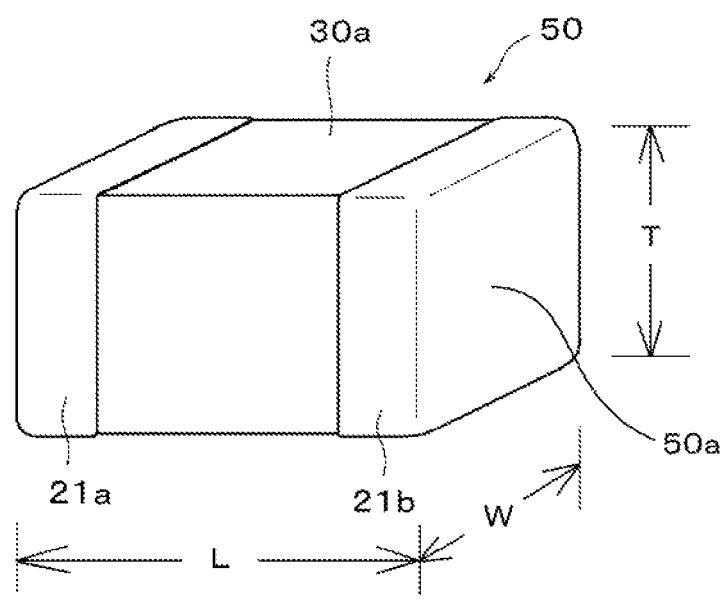
FIG. 2 illustrates the appearance of a multilayer electronic component (multilayer coil component) produced by a method of art example of the present invention.

In this way, a multilayer printed circuit chip (multilayer electronic component) 50 is obtained, in which, as illustrated in FIG. 2, a ceramic multilayer body 30a includes a coil 20 (refer to FIG. 1) therein and has at its opposite end portions a pair of outer electrodes 21a and 21b which are in electrical communication with the opposite end portions of the coil.

[5] Evaluation

In regard to each of the samples (multilayer printed circuit chips) prepared in the above manner, the occurrence of delamination and the occurrence of electrode disconnection were checked in the following manner.

(1) Occurrence of delamination

The occurrence (%) of delamination was checked in the following manner: in regard to 100 samples (multilayer printed circuit chips) of each of Examples 1 to 8 shown in Table 3A and Comparative Examples 1 to 6 shown in Table 3B prepared using the photosensitive conductive pastes, assuming that each of the 100 samples is a multilayer printed circuit chip 50 illustrated in FIG. 2, the multilayer printed circuit chip 50 was polished from an end face 50a defined by the thickness T and the width W to about, half the length (L in FIG. 2) and then a face (polished face) defined by the thickness T and the width W in the middle of the length was observed with a microscope (VHX-900available from KEYENCE CORPORATION.)

Then, if a gap of 20 μm or more in thickness was observed between a coil pattern (inner electrode) and an insulation layer in the sample (multilayer printed circuit chip), the sample was counted as a sample with delamination.

Then, the occurrence (%) of delamination was calculated using the following equation.

Occurrence of delamination (%)=[number of samples with delamination/total number of samples (100 samples)]×100

(2) Occurrence of electrode disconnection

One million samples (multilayer printed circuit chips) prepared using the photosensitive conductive pastes were treated with heat many rimes and the occurrence of electrode disconnection was evaluated. The disconnection was detected by detecting poor electrical connection in each sample.

Figure 3:
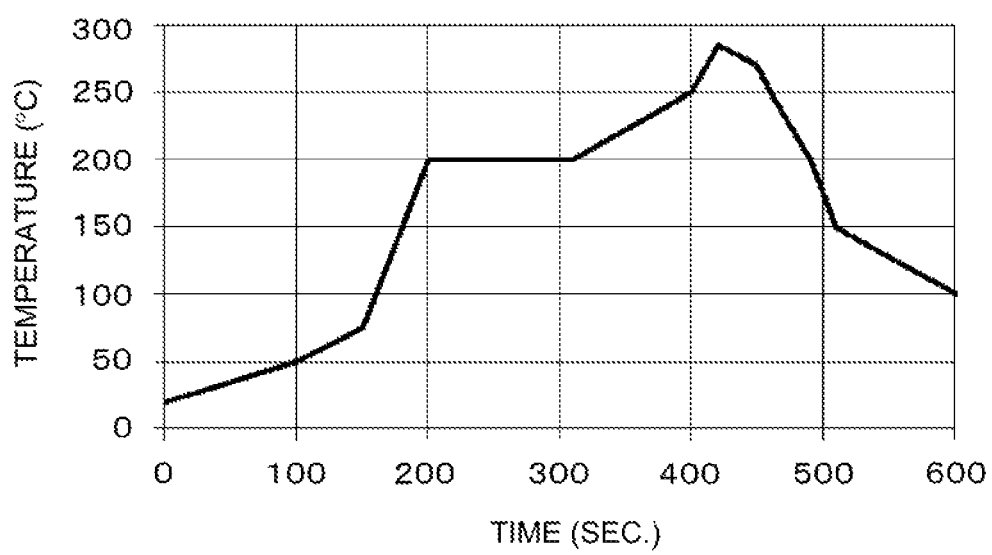
FIG. 3 is a graph showing the profile of heat treatment performed to check the occurrence of electrode disconnection in samples (multilayer printed circuit chips) of Examples of the present invention and Comparative Examples.

It should be noted that the heat treatment was performed by performing the profile shown in FIG. 3 five times with the use of a reflow soldering system (TNR15-225LH available from TAMURA Corporation).

Then, the occurrence of electrode disconnection was calculated using the following equation.

Occurrence of electrode disconnection (ppm)=(number of samples having disconnection/total number of samples evaluated)×$10^6$ The occurrence of delamination and the occurrence of electrode disconnection checked in the above manner are shown in Tables 3A and 3B.

(3) Evaluation on resolution

The resolution when a coil pattern is formed from each photosensitive conductive paste as described above by photolithography was evaluated in the following manner.

Each of the photosensitive conductive pastes (samples) used in Examples 1 to 8 and Comparative Examples 1 to 6 is applied by screen printing on an insulation layer (cured photosensitive glass film) formed of the photosensitive glass paste, and thereafter dried at 60° C. for 30 minutes, such that a photosensitive conductive paste film having a film thickness of 9 to 11 μm is formed.

Next, the photosensitive conductive paste film is exposed to a light beam of 600 mJ/$cm^2$ from an ultra-high pressure mercury lamp through a mask having lines of 25, 30, 35, 40, 45, and 50 μm in width.

After that, the photosensitive conductive paste film is developed with an alkaline aqueous solution to obtain electrode patterns.

Then, the obtained electrode patterns are checked, and the width of the finest electrode pattern that is confirmed to be formed is used as a resolution of the sample (photosensitive conductive paste). It should be noted that the "width of the finest electrode pattern confirmed" is the width of the line on the mask corresponding to this electrode pattern.

The resolutions (line widths) found in this way are also shown in Tables 3A and 3B.

It should be noted that, in regard to the resolution, the evaluation "No lines" in Tables 3A and 3B means that all the photosensitive conductive paste films (lines) (all the lines of 25 to 50 μm in width) were lost when developed.

This "No lines" state occurs because, when the exposure is performed, the light does not reach the bottom of the photosensitive conductive paste film (that is, the light stops in the middle in the thickness direction of the photosensitive conductive paste film) and the photosensitive conductive paste film does not cure in the area near the boundary with the insulation layer and thus the photosensitive conductive paste film, (line) is lost during development.

TABLE 3A

|  |  | Example 1 | Example 2 | Example 3 | Example 4 | Example 5 | Example 6 | Example 7 | Example 8 |
|---|---|---|---|---|---|---|---|---|---|
| Ag powder (mass %) | I | 82.0 | 82.0 |  |  | 82.0 | 70.3 | 85.6 | 82.0 |
|  | II |  |  | 82.0 | 82.0 |  |  |  |  |
| Glass frit (mass %) | A | 1.6 | 2.3 |  | 3.7 | 4.4 | 3.0 | 3.0 |  |
|  | B |  |  | 3.0 |  |  |  |  |  |
|  | C |  |  |  |  |  |  |  | 3.0 |
|  | D |  |  |  |  |  |  |  |  |
| Photosensitive resin composition (mass %) |  | 16.0 | 15.3 | 14.6 | 13.9 | 13.2 | 26.3 | 11.0 | 14.6 |
| Additive 1 (mass %) |  | 0.2 | 0.2 | 0.2 | 0.2 | 0.2 | 0.2 | 0.2 | 0.2 |
| Additive 2 (mass %) |  | 0.2 | 0.2 | 0.2 | 0.2 | 0.2 | 0.2 | 0.2 | 0.2 |
| Total |  | 100 | 100 | 100 | 100 | 100 | 100 | 100 | 100 |
| Softening point of glass frit (° C.) |  | 790 | 790 | 657 | 790 | 790 | 790 | 790 | 718 |
| Difference in refractive index between glass frit and photosensitive resin |  | 0.02 | 0.02 | 0.03 | 0.02 | 0.02 | 0.02 | 0.02 | 0.10 |
| Mass ratio of glass frit to Ag powder |  | 0.020 | 0.028 | 0.037 | 0.045 | 0.054 | 0.043 | 0.035 | 0.037 |
| Temperature at which sintering of Ag powder starts (° C.) |  | 550 | 550 | 490 | 490 | 550 | 550 | 550 | 550 |
| Occurrence of delamination (%) |  | 0 | 0 | 0 | 0 | 0 | 0 | 0 | 0 |
| Occurrence of electrode disconnection (ppm) |  | 14 | 0 | 0 | 0 | 0 | 20 | 0 | 0 |
| Resolution (μm) |  | 25 | 25 | 25 | 25 | 35 | 25 | 40 | 50 |

TABLE 3B

|  |  | Comparative Example 1 | Comparative Example 2 | Comparative Example 3 | Comparative Example 4 | Comparative Example 5 | Comparative Example 6 |
|---|---|---|---|---|---|---|---|
| Ag powder (mass %) | I | 82.0 | 82.0 | 68.0 | 88.0 | 80.6 | 82.0 |
|  | II |  |  |  |  |  |  |
| Glass frit (mass %) | A |  |  | 3.0 | 3.0 | 1.1 | 5.3 |
|  | B |  |  |  |  |  |  |
|  | C |  |  |  |  |  |  |
|  | D |  | 3.0 |  |  |  |  |
| Photosensitive resin composition (mass %) |  | 17.6 | 14.6 | 28.6 | 8.6 | 17.9 | 12.3 |
| Additive 1 (mass %) |  | 0.2 | 0.2 | 0.2 | 0.2 | 0.2 | 0.2 |
| Additive 2 (mass %) |  | 0.2 | 0.2 | 0.2 | 0.2 | 0.2 | 0.2 |
| Total |  | 100 | 100 | 100 | 100 | 100 | 100 |
| Softening point of glass frit (° C.) |  | — | 471 | 790 | 790 | 790 | 790 |
| Difference in refractive index between glass frit and photosensitive resin |  | — | 0.05 | 0.02 | 0.02 | 0.02 | 0.02 |
| Mass ratio of glass frit to Ag powder |  | 0 | 0.037 | 0.044 | 0.034 | 0.014 | 0.065 |
| Temperature at which sintering of Ag powder starts (° C.) |  | 550 | 550 | 550 | 550 | 550 | 550 |
| Occurrence of delamination (%) |  | 100 | 57 | 86 | — | 78 | — |
| Occurrence of electrode disconnection (ppm) |  | 210 | 144 | 152 | — | 168 | — |
| Resolution (μm) |  | 25 | 35 | 25 | No lines | 25 | No lines |

Table 3A demonstrates that, in the case where the photosensitive conductive pastes of Examples 1 to 8 satisfying the requirements of the present invention are used, the occurrence of delamination is 0% and the occurrence of electrode disconnection is 20 ppm or less.

It is apparent that this was because the use of a glass frit having a softening point higher than the temperature at which sintering of Ag starts reduced the shrinkage of the photosensitive conductive paste when sintered and thus the difference in shrinkage between the insulation layer (that is, the photosensitive glass paste for forming an insulation layer) and the photosensitive conductive paste decreased.

It was also confirmed that, when the absolute value of the difference in refractive index between the glass frit and the photosensitive resin composition is 0.10 or less, a resolution that is as fine as 50 μm or less can be achieved. This is because, when the absolute value of the difference in refractive index is 0.10 or less, the scattering of light was reduced when the photosensitive conductive paste film is exposed and the light is allowed to pass through the entire thickness from the entrance surface of the photosensitive conductive paste film to the boundary with the insulation layer.

It was also confirmed that the photosensitive conductive paste of Comparative Example 1 containing no glass frit has a large shrinkage upon sintering and the occurrence of delamination is 100% and is not preferred.

It was also confirmed that, in the case of the photosensitive conductive paste of Comparative Example 2 containing a glass frit having a softening point below the temperature at which sintering of the Ag powder starts, the occurrence of delamination is as high as 57%, which is not preferred. This is because, since the glass is also sintered when the Ag powder is sintered, the shrinkage upon sintering does not become small.

The above-described results of Comparative Example 2 demonstrate that, in the case where the softening point of the glass frit is below the temperature at which sintering of the conductive powder (Ag powder) starts, the occurrence of delamination and the occurrence of electrode disconnection increase even if the absolute value of the difference in refractive index is 0.10 or less, the mass ratio of the glass frit to the conductive powder (Ag powder) is 0.020 to 0.054, and the amount of the conductive powder in the paste is within the earlier-describe range of the present invention (70.3 to 85.6 mass %).

It was also confirmed that, also in the case of the photosensitive conductive paste of Comparative Example 3 containing a small amount, 68 mass %, of the Ag powder, the occurrence of delamination is as high as 86%, which is not preferred. It is apparent that this is because, in the case where the amount of the Ag powder is less than the range of the present invention, the shrinkage upon sintering cannot be sufficiently reduced.

It was also confirmed that, in the case of the photosensitive conductive paste of Comparative Example 4 in which the amount of Ag powder is 88 mass % which is above the range of the present invention, the coating of the photosensitive conductive paste becomes fluid during development and cannot be patterned (no lines are left). This is because light is blocked by the Ag powder during exposure and cannot easily reach the bottom of the photosensitive conductive paste film.

The above-described results of Comparative Examples 3 and 4 demonstrate that, even in the case where the softening point of the glass frit is equal to or above the temperature at which sintering of the conductive powder (Ag powder) starts, the absolute value of the difference in refractive index is 0.10 or less, and the mass ratio of the glass frit to the conductive powder (Ag powder) is 0.020 to 0.054, the firing shrinkage is large and the occurrence of delamination and the occurrence of disconnection in conductors cannot be reduced when the amount of the conductive powder (Ag powder) in the paste is below the earlier-described range of the present invention (70.3 mass % or more and 85.6 mass % or less) (Comparative Example 3) and, when the amount of the conductive powder (Ag powder) is above the range of the present invention (70.3 mass % or more and 85.6 mass % or less) (Comparative Example 4), the UV light does not readily reach the bottom of the photosensitive conductive paste film during exposure and the resolution that is as fine as 50 μm cannot, be achieved.

It was also confirmed that, in the case of the photosensitive conductive paste of Comparative Example 5 in which the mass ratio of the glass frit to the Ag powder is as small as 0.014 (that is, the amount of the glass frit is small), the occurrence of delamination is as high as 78% and the occurrence of electrode disconnection is also as high as 168 ppm, which is not preferred.

The results demonstrate that, when the mass ratio of the glass frit to the Ag powder is 0.014 (which is below the range of the present invention), the amount of shrinkage upon sintering does not decrease and the occurrence of delamination and the occurrence of electrode disconnection increase.

It was also confirmed that, in the case of the photosensitive conductive paste of Comparative Example 6 in which the mass ratio of the glass frit to the Ag powder is as large as 0.065 (that is, the amount of the glass frit is large), the coating of the photosensitive conductive paste becomes fluid during development and cannot be patterned (no lines are left).

It is apparent that this is because, when the percentage of the glass frit is above the range of the present invention, the light is scattered during exposure and the light does not readily reach the bottom of the photosensitive conductive paste film.

On the other hand, it was confirmed that, with the use of a photosensitive conductive paste that satisfies the requirements of the present invention, that is, with the use of a photosensitive conductive paste which contains a conductive powder accounting for 70.3 to 85.6 mass % of the total amount of the photosensitive conductive paste, a photosensitive resin composition, and a glass frit and in which the mass ratio of the glass frit to the conductive powder is 0.020 to 0.054 and the softening point of the glass frit is equal to or above the temperature at which sintering of the conductive powder starts, it is possible to reduce the shrinkage upon firing and reduce delamination between an insulation layer and an electrode and disconnection in an electrode connection. Thus, it is possible to obtain a highly reliable multilayer electronic component.

It should be noted that, although the above embodiments were described by using a multilayer coil component as an example of a multilayer electronic component, the present invention is applicable to not only the multilayer coil component but also various multilayer electronic components such as multilayer ceramic boards and multilayer LC composite components.

The present invention is not limited to the above examples also in other points and may be used in various applications and may be modified in various ways in terms of the properties of a conductive powder, the composition of a photosensitive resin composition, a material constituting an insulation layer, and the like within the scope of the present invention.

The invention claimed is:

1. A photosensitive conductive paste comprising:
   (a) a conductive powder in an amount of 70.3 to 85.6 mass % with respect to a total amount of the photosensitive conductive paste;
   (b) a photosensitive resin composition containing an alkali-soluble polymer, a photosensitive monomer, a photopolymerization initiator, and a solvent; and
   (c) a glass frit,
   wherein a mass ratio of the glass frit to the conductive powder is 0.020 to 0.054,
   the glass frit has a softening point that is equal to or above a temperature at which sintering of the conductive powder starts, and
   the softening point of the glass frit is 657° C. or higher.

2. The photosensitive conductive paste according to claim 1, wherein an absolute value of a difference in refractive index between the photosensitive resin composition and the glass frit is 0.10 or less.

3. The photosensitive conductive paste according to claim 1, wherein an absolute value of a difference in refractive index between the photosensitive resin composition and the glass frit is 0.03 or less.

4. The photosensitive conductive paste according to claim 3, wherein the conductive powder is 70.3 to 82.0 mass % of the total amount of the photosensitive conductive paste.

5. The photosensitive conductive paste according to claim 1, wherein the conductive powder contains an Ag powder.

6. The photosensitive conductive paste according to claim 1, wherein the conductive powder contains a first Ag powder having an average particle size of 4.0 μm and a second Ag powder having an average particle size of 2.0 μm.

7. The photosensitive conductive paste according to claim 1, wherein the alkali-soluble polymer is an acrylic polymer with a side chain that includes a carboxyl group.

8. The photosensitive conductive paste according to claim 1, wherein the photosensitive monomer is selected from dipentaerythritol monohydroxy pentaacrylate, hexanediol triacrylate, tripropylene glycol triacrylate, trimethylolpropane triacrylate, EO-modified trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethyleneglycol diacrylate, ethoxylated bisphenol A diacrylate, propoxylated neopentylglycol diacrylate, tris(2-hydroxyethyl)isocyanurate triacrylate, pentaerythritol triacrylate, propoxylated trimethylolpropane triacrylate, propoxylated glyceryl triacrylate, pentaerythritol tetraacrylate, ditrimethylolpropane tetraacrylate, and ethoxylated pentaerythritol tetraacrylate.

9. The photosensitive conductive paste according to claim 1, wherein the photopolymerization initiator is selected from 2-methyl-1[4-(methylthio)phenyl]-2-morpholino propane, benzil, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyl dimethyl ketal, 2-n-butoxy-4-dimethylamino benzoate, 2-chloro thioxanthone, 2,4-diethyl thioxanthone, 2,4-diisopropyl thioxanthone, isopropylthioxanthone, 2-dimethylaminoethyl benzoate, p-dimethylamino ethyl benzoate, p-dimethylamino isoamyl benzoate, 3,3'-dimethyl-4-methoxybenzophenone, 2,4-dimethyl thioxanthone, 1-(4-dodecylphenyl)-2-hydroxy-2-methylpropane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, methyl benzoyl formate, 1-phenyl- 1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentyl phosphine oxide, and bis(2,4,6-trimethylbenzoyl)phenylphosphine oxide.

10. The photosensitive conductive paste according to claim 1, wherein
   the alkali-soluble polymer is an acrylic polymer with a side chain that includes a carboxyl group,
   the photosensitive monomer is dipentaerythritol monohydroxy pentaacrylate, and
   the photopolymerization initiator is 2-methyl-1[4-(methylthio)phenyl]-2-morpholino propane.

11. A method of producing a multilayer electronic component, the method comprising:
co-firing a multilayer body including a conductor layer formed of a photosensitive conductive paste and an insulation layer formed of a photosensitive insulating paste containing an insulative inorganic constituent and a photosensitive organic constituent,
wherein the photosensitive conductive paste includes:
(a) a conductive powder in an amount of 70.3 to 85.6 mass % with respect to a total amount of the photosensitive conductive paste;
(b) a photosensitive resin composition containing an alkali-soluble polymer, a photosensitive monomer, a photopolymerization initiator, and a solvent; and
(c) a glass frit,
wherein a mass ratio of the glass frit to the conductive powder is 0.020 to 0.054,
the glass frit has a softening point that is equal to or above a temperature at which sintering of the conductive powder starts, and
the softening point of the glass frit is 657° C. or higher.

12. The method of producing a multilayer electronic component according to claim 11, wherein an absolute value of a difference in refractive index between the photosensitive resin composition and the glass frit is 0.10 or less.

13. The method of producing a multilayer electronic component according to claim 11, wherein an absolute value of a difference in refractive index between the photosensitive resin composition and the glass frit is 0.03 or less.

14. The method of producing a multilayer electronic component according to claim 13, wherein the conductive powder is 70.3 to 82.0 mass % of the total amount of the photosensitive conductive paste.

15. The method of producing a multilayer electronic component according to claim 11, wherein the alkali-soluble polymer is an acrylic polymer with a side chain that includes a carboxyl group.

16. The method of producing a multilayer electronic component according to claim 11, wherein the photosensitive monomer is selected from dipentaerythritol monohydroxy pentaacrylate, hexanediol triacrylate, tripropylene glycol triacrylate, trimethylolpropane triacrylate, EO-modified trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethyleneglycol diacrylate, ethoxylated bisphenol A diacrylate, propoxylated neopentylglycol diacrylate, tris(2-hydroxyethyl)isocyanurate triacrylate, pentaerythritol triacrylate, propoxylated trimethylolpropane triacrylate, propoxylated glyceryl triacrylate, pentaerythritol tetraacrylate, ditrimethylolpropane tetraacrylate, and ethoxylated pentaerythritol tetraacrylate.

17. The method of producing a multilayer electronic component according to claim 11, wherein the photopolymerization initiator is selected from 2-methyl-1[4-(methylthio)phenyl]-2-morpholino propane, benzil, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyl dimethyl ketal, 2-n-butoxy-4-dimethylamino benzoate, 2-chloro thioxanthone, 2,4-diethyl thioxanthone, 2,4-diisopropyl thioxanthone, isopropylthioxanthone, 2-dimethylaminoethyl benzoate, p-dimethylamino ethyl benzoate, p-dimethylamino isoamyl benzoate, 3,3'-dimethyl-4-methoxybenzophenone, 2,4-dimethyl thioxanthone, 1-(4-dodecylphenyl)-2-hydroxy-2-methylpropane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, methyl benzoyl formate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentyl phosphine oxide, and bis(2,4,6-trimethylbenzoyl)phenylphosphine oxide.

18. The method of producing a multilayer electronic component according to claim 11, wherein
the alkali-soluble polymer is an acrylic polymer with a side chain that includes a carboxyl group,
the photosensitive monomer is dipentaerythritol monohydroxy pentaacrylate, and
the photopolymerization initiator is 2-methyl-1[4-(methylthio)phenyl]-2-morpholino propane.

* * * * *